United States Patent [19]

Koden

[11] Patent Number: 4,857,907
[45] Date of Patent: Aug. 15, 1989

[54] LIQUID-CRYSTAL DISPLAY DEVICE

[75] Inventor: Mitsuhiro Koden, Nara, Japan

[73] Assignee: 501 Sharp Kabushiki Kaisha, Osaka, Japan

[21] Appl. No.: 43,342

[22] Filed: Apr. 28, 1987

[30] Foreign Application Priority Data

| Apr. 30, 1986 | [JP] | Japan | 61-102979 |
| May 23, 1986 | [JP] | Japan | 61-119685 |
| May 30, 1986 | [JP] | Japan | 61-126578 |
| Jun. 25, 1986 | [JP] | Japan | 61-150569 |

[51] Int. Cl.$^4$ .............................................. G09G 3/36
[52] U.S. Cl. ........................... 340/784; 340/717; 340/718; 350/336
[58] Field of Search ............... 340/765, 784, 718, 719; 350/336, 334; 357/23.7

[56] References Cited

U.S. PATENT DOCUMENTS

| 4,569,574 | 2/1986 | Masaki et al. | 350/336 |
| 4,687,298 | 8/1987 | Aoki et al. | 350/334 |
| 4,697,331 | 10/1987 | Boulitrop et al. | 350/336 |
| 4,698,627 | 10/1987 | den Boer et al. | 340/719 |
| 4,704,002 | 11/1987 | Kibuchi et al. | 350/334 |
| 4,705,358 | 11/1987 | Yamazaki et al. | 350/334 |
| 4,723,838 | 2/1988 | Aoki et al. | 350/336 |

Primary Examiner—Gerald L. Brigance
Attorney, Agent, or Firm—Irell & Manella

[57] ABSTRACT

A liquid-crystal display device comprising thin-film transistors arrayed in a matrix, wherein each of said thin-film transistors comprises an insulating substrate, a gate electrode disposed on said insulating substrate, a first insulating film covering said gate electrode, an a-Si semiconductor film disposed on said first insulating film, a second insulating film disposed on said a-Si semiconductor film, a p-doped n+-amorphous Si film forming both a source and a drain on said a-Si semiconductor film and said second insulating film, a third insulating film covering said p-doped n+-amorphous Si film, except for a part of said p-doped n+-amorphous Si film, and said a-Si semiconductor film, a source electrode and a drain electrode forming junctions with said part of the p-doped n+-amorphous Si film and covering said third insulating film, and a picture-element electrode, a part of which is superposed on said drain electrode.

8 Claims, 7 Drawing Sheets

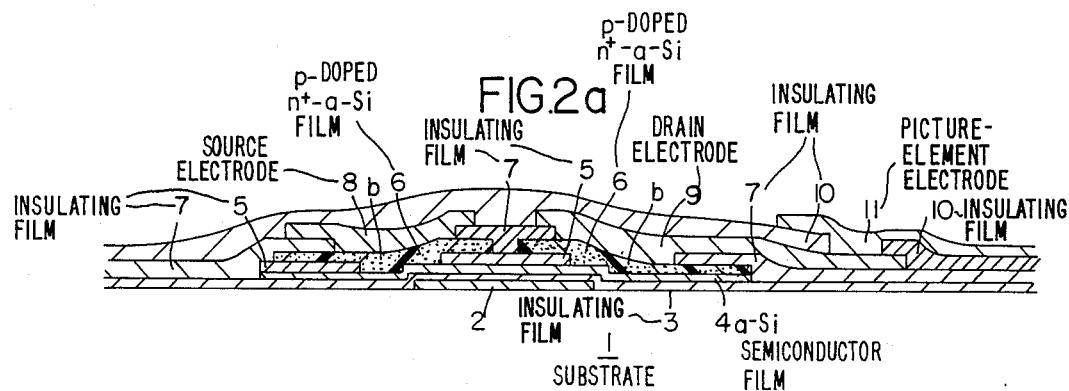
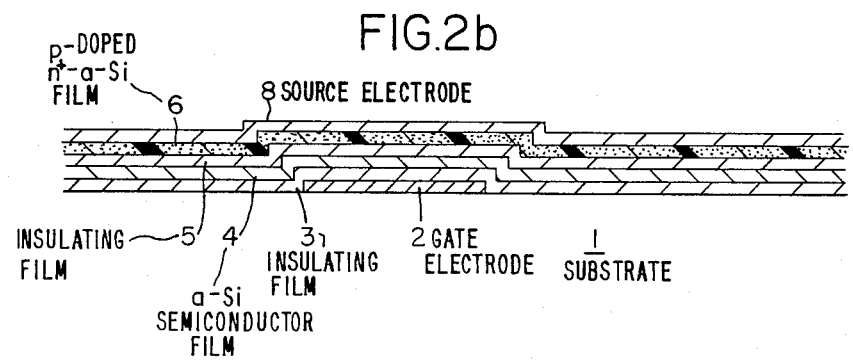

FIG. 7
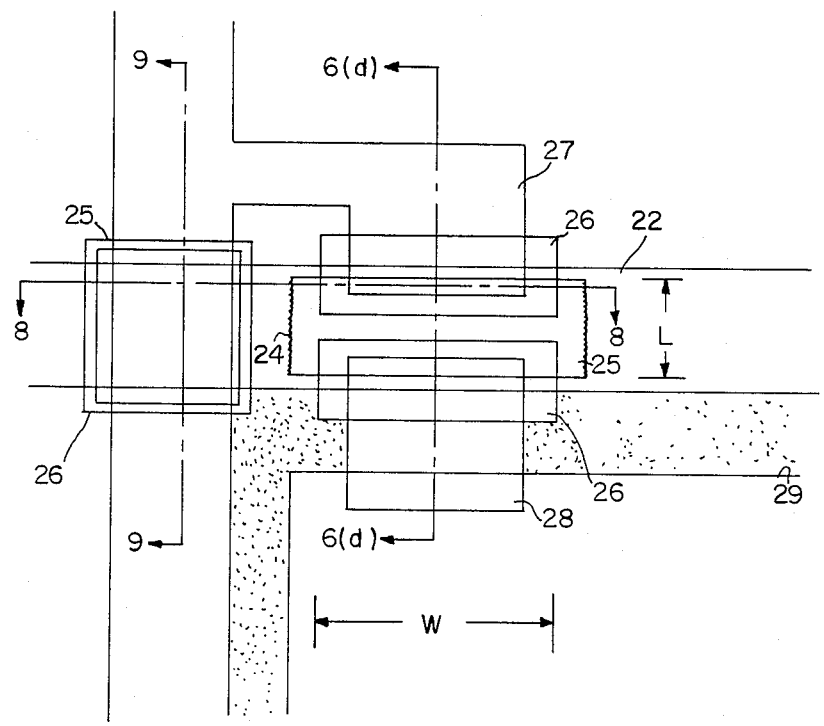
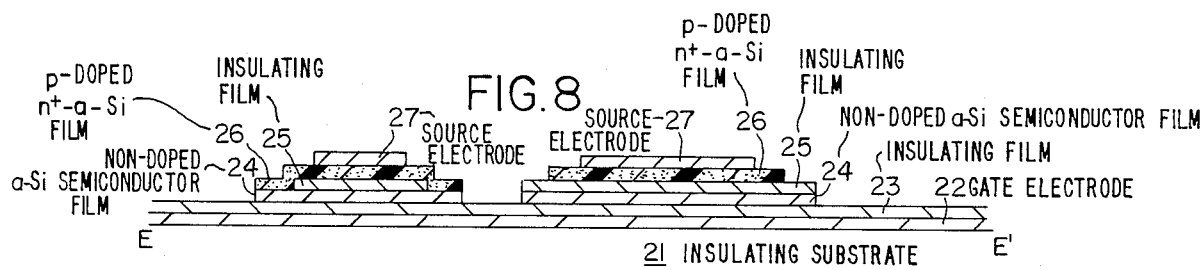
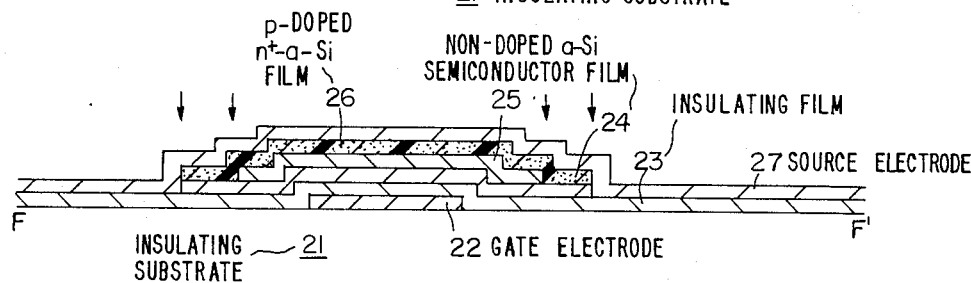

LIQUID-CRYSTAL DISPLAY DEVICE

BACKGROUND OF THE INVENTION

1. Field of the Invention

This invention relates to a thin-film transistor that uses a semiconductor of amorphous silicon.

2. Description of the Prior Art

In recent years, there has been a good potential market for active-matrix display devices, as large-scale display devices that use liquid crystals, etc., in which thin-film transistors (TFT) made with the use of a semiconductor of amorphous silicon (a-Si) are formed in a matrix on an insulating substrate such as glass, etc.

FIGS. 6(a) to 6(d) show a process for the production of a conventional TFT. First, a gate electrode 22 is formed on an insulating substrate 21 made of glass, etc. Then, a first insulating film 23, a non-doped a-Si semiconductor film 24, and a second insulating film 25 are disposed thereon, in that order (FIG. 6(a)). Then, the second insulating film is patterned so as to remain on the gate electrode 22 (FIG. 6(b)), followed by the disposition of a phosphorus-doped n+-a-Si film 26, and the a-Si semiconductor film 24 is then patterned (FIG. 6(c)). Then, a metal film such as Al, Ti, Mo, etc., is deposited on the entire surface of the substrate, followed by the patterning of this metal film to form a source electrode 27 and a drain electrode 28. Thereafter, a picture-element electrode 29 is formed from a transparent conductive film so that one part of the drain electrode 28 is overlapped, resulting in a TFT, the flat surface of which is shown in FIG. 7.

The conventional liquid-crystal display devices are disadvantageous in that (1) it is difficult to obtain good $R_{off}$ characteristics, (2) short-circuits occur readily between the gate electrode and the source electrode, (3) scattering of the picture-displaying characteristics occurs readily, (4) the bus bar of the source electrode breaks readily, (5) short-circuits between the source electrode and the picture electrode occur readily, and (6) the ratio of the surface area of the picture-element electrode to the surface area of the liquid-crystal display panel is low.

First, it is explained as follows why it is difficult to obtain good $R_{off}$ characteristics. For example, when the width L of the second insulating film 25 of the TFT is 10 μm, when the width W of the n+-a-Si film 26 is 30 μm, and when gate voltage is not applied, there is scattering on the order of $10^4-10^{11}$ Ω of the resistance inside and outside of the panel between the source and the drain, so that a satisfactory display cannot be obtained when the liquid-crystal cell is assembled with the said TFT.

The reason is that at the time of the disposition of a metal film constituting the source electrode 27 and the drain electrode 28, the edge part of the a-Si semiconductor film 24 (i.e., the stippled area shown in FIGS. 7 and 8) and the metal film for the source electrode 27 and the drain electrode 28 react, resulting in a conductive reaction layer.

Next, it is discussed why short-circuits occur readily between the gate electrode and the source electrode. The TFT at each point of intersection in the active-matrix substrate that is formed by the disposition of a plurality of TFTs in a matrix on an insulating substrate is driven in a line-sequential mode. That is, a scanning signal is input from one gate bus bar to be scanned, and data signals are input from each source bus bar. There are many points of intersection between the gate bus bars and the source bus bars. For example, in a matrix of 250×250, there are 62,500 points of intersection. If, among these many points of intersection, even one permits a leak between the gate and source, a cross-shaped line defect inevitably occurs between the corresponding gate bus bar and the corresponding source bus bar, so that a satisfactory display cannot be obtained and the yield of the active-matrix substrate becomes zero. More certainty of the insulation between the gate and the source is required with an increase in the number of gate bus bars and source bus bars.

Next, it is explained why scattering of the picture-displaying characteristics occurs readily.

With a conventional active-matrix substrate that uses the above-mentioned TFTs, none of the gate bus bars and none of the source bus bars are equipotential, so the following problems occur. The source bus bars are not equipotential to each other. Accordingly, a difference in the threshold voltage of these TFTs arises because of static electricity created between the TFTs connected to different source bus bars during the manufacturing process, and when liquid-crystal cells are incorporated into this active-matrix substrate and used as a display device, stripes appear along the source bus bars. Also, with each gate bus bar, the same trouble as with the source bus bars occurs, and a satisfactory picture-display cannot be obtained.

Next, the reason for the source bus bars breaking readily is discussed. One method often used to prevent the above-mentioned defect in which short-circuits between the gate and the source readily occur is to introduce an a-Si semiconductor film, an insulating film, etc., at the points of intersection between the gate bus bars and the source bus bars. In the conventional method shown in FIGS. 7 and 9, an a-Si semiconductor film 24 and a protective insulating film 25 have been introduced at the points of intersection between the gate bus bars 22 and the source bus bars 27.

However, when this method is used, it is not uncommon for breaking of the portions of the source bus bars 27 corresponding to the step-portions of the protective insulating film 25, the a-Si film 24, and the a-Si film to occur (shown in FIG. 9 by the arrows).

Next, the reason for short-circuits occurring readily between the source electrode and the picture-element electrode is discussed.

In the conventional TFT shown in FIGS. 6 and 7, the source electrode 27 and the picture-element electrode 29 are on the same insulating film, so that in the stippled area of FIG. 7, etching of the source electrode 27 and the picture-element electrode 29 is not satisfactory, and leaks occur readily.

Next, the reason why the ratio of the surface area of the picture-element electrode to the surface area of the liquid-crystal display panel is low is discussed below. In order to prevent short-circuits between the source electrode and the picture-element electrode, the source electrode and the picture-element electrode must be separated on the insulating film. If the gate electrode 22 and the picture-element electrode 29 are overlapped in the same plane, a parasitic capacity between the gate electrode and the picture-element electrode is created, which has a bad effect on large-capacity displays. For this reason, so that the gate electrode 22 and the picture-element electrode 29 cannot be overlapped in the same plane, the gate electrode 22 and the picture-element electrode 29 must be separated in a plane by the stippled area shown in FIG. 7. As mentioned above, when a display is made with an active-matrix that uses the conventional TFT, a non-lighting region is required in the stippled area shown in FIG. 7, which lowers the ratio of the surface area of the picture-element electrode to the surface area of the liquid-crystal display panel.

SUMMARY OF THE INVENTION

The liquid-crystal display device of this invention, which overcomes the above-discussed and numerous other disadvantages and deficiencies of the prior art, comprises thin-film transistors arrayed in a matrix, wherein each of said thin-film transistors comprises an insulating substrate, a gate electrode disposed on said insulating substrate, a first insulating film covering said gate electrode, an a-Si semiconductor film disposed on said first insulating film, a second insulating film disposed on said a-Si semiconductor film, a p-doped $n^+$-amorphous Si film forming both a source and a drain on said a-Si semiconductor film and said second insulating film, a third insulating film covering said p-doped $n^+$-amorphous Si film, except for a part of said p-doped $n^+$-amorphous Si film, and said a-Si semiconductor film, a source electrode and a drain electrode forming junctions with said part of the p-doped $n^+$-amorphous Si film and covering said third insulating film, and a picture-element electrode, a part of which is superposed on said drain electrode.

In a preferred embodiment, bus bars connected to said gate electrode and bus bars connected to said source electrode are connected by a short ring of a p-doped $n^+$-amorphous Si film.

In a preferred embodiment, the resistance between the gate bus bars is different from that between the source bus bars.

In a preferred embodiment, the resistance between the gate bus bars is lower than that between the source bus bars.

In a preferred embodiment, the portions on which the source bus bars are disposed have said second insulating film and said a-Si semiconductor film.

In a preferred embodiment, the thin-film transistor further comprises a fourth insulating film disposed over the entire surface of the substrate including the source electrode and the drain electrode, said fourth insulating film having a hole in the portion thereof positioned above said drain electrode, and said picture-element electrode attaining self-alignment with respect to said gate and source electrodes and being connected to said drain electrode through the hole.

Thus, the invention described herein makes possible the objects of (1) providing a liquid-crystal display device that has a TFT structure by which a reaction of the metal used for the source and drain electrodes with an a-Si semiconductor film can be prevented, resulting in excellent $R_{off}$ characteristics; (2) providing a liquid-crystal display device in which since the gate bus bars and the source bus bars are connected to each other by a p-doped $n^+$-a-Si film short ring, short-circuits between the gate electrode and the source electrode do not occur and scattering of the picture-displaying characteristics within the liquid-crystal display panel is prevented; (3) providing a liquid-crystal display device in which the step portions that result from the disposition of the source bus bars beyond the gate bus bars are made small, so that the occurrence of breakage of the source bus bars can be effectively prevented; (4) providing a liquid-crystal display device in which short-circuits between the source electrode and the picture-element electrode are prevented by the source electrode being separated from the picture-element electrode by an insulating film; and (5) providing a liquid-crystal display device in which the picture-element electrode attains self-alignment with respect to the gate and source electrodes, resulting in a great ratio of the surface area of the picture-element electrode to the surface area of the liquid-crystal display panel, which allows a bright and distinctive display to be obtained.

BRIEF DESCRIPTION OF THE DRAWINGS

This invention may be better understood and its numerous objects and advantages will become apparent to those skilled in the art by reference to the accompanying drawings as follows:

FIGS. 2(a) and 2(b), respectively, are cross-sectional views along lines 2(a)—2(a) and 2(b)—2(b) of FIG. 1.

FIGS. 6(a) to 6(d) are schematic diagrams showing a process for the manufacture of a conventional TFT, wherein FIG. 6(d) is a cross-sectional view along line 6(b)—6(b) of FIG. 7.

FIG. 7 is a plane view showing the conventional TFT manufactured by the process shown in FIGS. 6(a) to 6(d).

FIG. 8 is a cross-sectional view along line 8—8 of FIG. 7.

FIG. 9 is a cross-sectional view along line 9—9 of FIG. 7.

DESCRIPTION OF THE PREFERRED EMBODIMENTS

EXAMPLE 1

Figure 1:
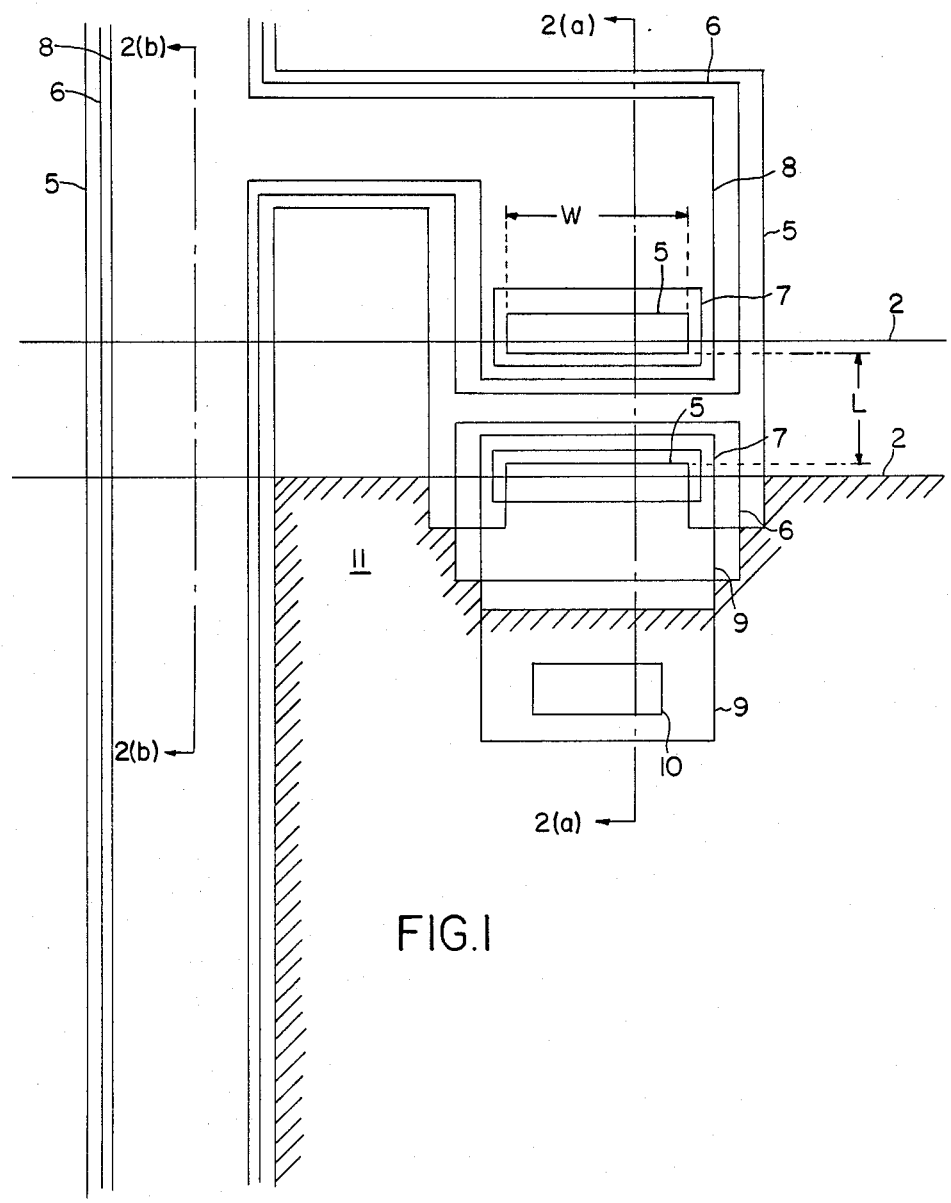
FIG. 1 is a plane view showing a thin-film transistor (TFT) of this invention.

FIG. 1 shows a plane view showing a TFT of this invention, which comprises, as shown in FIG. 2(a), a glass substrate 1, a gate electrode 2 disposed on the glass substrate 1, a first insulating film 3 covering the gate electrode 2, an a-Si semiconductor film 4 disposed on the first insulating film 3, a second insulating film 5 disposed on the a-Si semiconductor film 4, a p-doped $n^+$-a-Si film 6 forming both a source and a drain on the a-Si semiconductor film 4 and the second insulating film 5, a third insulating film 7 covering the p-doped $n^+$-a-Si film 6 (except for a part b of the p-doped $n^+$-a-Si film 6) and the a-Si semiconductor film 4, and a source electrode 8 and a drain electrode 9 forming junctions with the said part b of the p-doped $n^+$-a-Si film 6 and covering the third insulating film 7. The TFT further comprises a fourth insulating film 10 on the entire surface of the substrate, wherein the fourth insulating film 10 has a hole above the part of the drain electrode 9, and a picture-element electrode 11 made of a transparent conductive film forms a junction with the drain electrode 9 through the said hole of the fourth insulating film 10.

In this example of this invention, at the time of the manufacture of the TFT, the insulating film 7 electrically separates the a-Si semiconductor film 4 from the films of metals or metal oxides, which form the source electrode 8 and the drain electrode 9. That is, an insulating film is disposed between the semiconductor device portion and the source and drain electrode portions, so that reaction between the source and drain electrode films and the a-Si semiconductor film does not occur.

In the TFT of this example, when the length L of the protective insulating film 5 is 10 μm, and the width W thereof is 30 μm, the $R_{off}$ can be set to be 10 Ω or less.

Next, to eliminate the problems of the prior art of the short-circuits between the gate and the source and of the scattering of the picture-displaying characteristics, as mentioned before, the gate bus bars and the source bus bars are brought into contact with each other by a phosphorus-doped n+-amorphous silicon, so that all of the gate bus bars and all of the source bus bars are in contact and equipotential is maintained. Therefore, the threshold voltages of each TFT do not scatter, and when the display device is made by incorporation of liquid-crystal cells thereinto, a uniform image without a display of stripes can be obtained. Moreover, there are almost no leaks between the gate electrodes and the source electrodes of the TFT, so that deterioration of the characteristics because of static electricity can be prevented.

Figure 3:
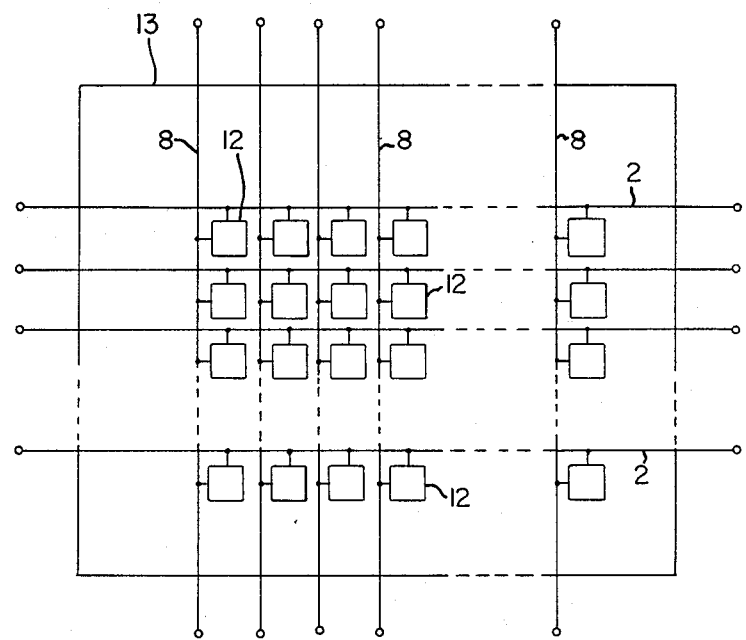
FIG. 3 is a schematic diagram showing an active-matrix substrate used in this invention.

FIG. 3 shows an active-matrix substrate of this invention, wherein on an insulating substrate made of a glass plate, etc. (not shown), a number of gate bus bars 2 and source bus bars 8 are disposed in the directions of lines and rows, respectively, resulting in a gridiron layout, and each gate bus bar 2 and source bus bar 8 have points of intersection, at which the TFTs 12 are arranged so that the gate electrodes and the source electrodes can be electrically connected to the electrodes with their respective gate bus bars 2 and the source bus bars 8, respectively. Then, a short ring 13 made of a p-doped n+-a-Si film 6, which surrounds these TFTs 12, is electrically connected to all of the gate bus bars 2 and source bus bars 8 intersecting therewith. This short ring 13 made of the n+-a-Si film 6 doped with phosphorus is used so as to achieve ohmic contact between the source electrode and drain electrode of the TFT 12 and the non-doped a-Si semiconductor film, so that, as mentioned above, although the gate bus bars 2 are connected to the source bus bars 8 by the short ring 13 made of the n+-a-Si film, this does not cause any increase in steps of the manufacturing procedure.

For the n+-a-Si film, a thickness of about 300-1000 Å is always used, and in this case, the surface resistance of the n+-a-Si film 6 differs depending on the method for the manufacture of the film, but it is in the range of about 10-300 MΩ/cm². Now, provisionally, in the case in which the short ring 13 is made of an n+-a-Si film with a surface resistance of 100 MΩ/cm², when the adjacent source bus bars 8 are connected to each other by the n+-a-Si film 6 with a bar width of 400 μm and a bar length of 200 μm, and the adjacent gate bus bars 2 are connected to each other by the n+-a-Si film with a bar width of 400 μm and a bar length of 4 μm; in addition, when the adjacent gate bus bars 2 and source bus bars 8 are connected to each other by the n+-a-Si film 6 with a bar width of 400 μm and a bar length of 40 μm, the resistance between adjacent source bus bars 8 is 50 MΩ, the resistance between the gate bus bars 2 is 1 MΩ, and the resistance between the gate bus bars 2 and the source bus bars 8 is 10 MΩ. On the other hand, it is extremely easy to establish the output impedance of the driver of this active-matrix substrate at several tenths of the above-mentioned value for each resistance, so even if, as in this example, each gate bus bar 2 and each source bus bar 8 are brought into contact with the short ring 13, then when looked at from the side of the driver, each gate bus bar 2 and each source bus bar 8 do not actually come to be part of an electrical short circuit. Therefore, by selective driving of the given gate bus bars 2 and source bus bars 8 by means of the driver, the desired TFT 12 can be selectively driven in the same manner as that of the conventional TFT, and the circuit incorporated into the active-matrix substrate of this example can be driven in the same way as that of the conventional substrate regardless of the existence of the short ring 13.

When the liquid-crystal cells are connected to the drain electrodes of each TFT of the active-matrix substrate of this example to form a display device of large capacity, the leaks arising between the gate bus bars 2 and/or the source bus bars 8 are negligible in practical uses. Moreover, since a near equipotential is maintained in each gate bus bar 2 and each source bus bar 8 by the short ring 13, each TFT 12 does not have a different threshold voltage, which allows a uniform picture-display to be obtained. In particular, in this example, as mentioned above, the resistance between the gate bus bars 2 is established so as to be lower than the resistance between the source bus bars 8, thereby allowing for the desired results when there is driving of the liquid crystals. Moreover, it is difficult for a leak between the gate bus bars 2 and the source bus bars 8 to occur, so that the display device can be manufactured in high yield and with reliability.

Next, to eliminate the problem of the prior art in which breakage of the source bus bars occurs, the step portions are minimized in the TFT of this example as shown in FIG. 2(b), which illustrates the structure of the intersection between the gate bus bars 2 and the source bus bars 8. Since the step portions are formed to be smaller than the conventional TFT shown in FIG. 9, breakage of bus bars is less likely to occur. Moreover, the source bus bars 8 should be disposed beyond the gate bus bars 2, and breakage of the bus bars there is conceivable, but if a Ta film of 2000 Å thick is patterned to form the gate electrodes and the gate bus bars by being etched by a mixture of hydrofluoric acid and nitric acid, the Ta film undergoes a side-etching because of the etchant, resulting in gate electrodes and gate bus bars with smoothly tapered edges, which prevents breakage of the source bus bars. For that reason, the probability of a break of the source bus bars 8 occurring at the intersection between the source bus bars 8 and the gate bus bars is very much lower.

Next, to eliminate the problems of the prior art of short-circuits occurring readily between the source electrodes and the picture-element electrodes and also of the lowering of the ratio of the surface area of the picture-element electrode to the surface area of the liquid-crystal display panel, as shown in FIG. 2(a), the TFT region and the picture-element electrode 11 are separated from each other by the insulating film 10, so that short-circuits between the source electrode 8 and the picture-element 11 can be prevented. Moreover, picture-element electrode 11 is formed so as to attain self-alignment with respect to the gate bus bars and the source bus bars, so that an increase in the ratio of the the surface area of the picture-element electrode to the surface area of the liquid-crystal display panel can be attained.

Figure 4A:
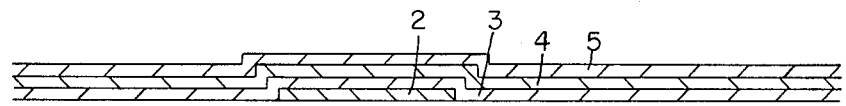
FIGS. 4(a) to 4(h) are schematic diagrams showing a process for the manufacture of the TFT shown in FIG. 1.
Figure 4B:
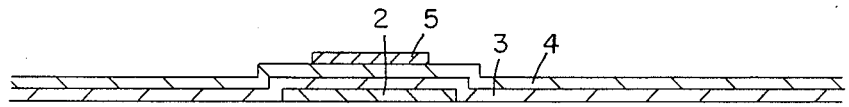
Figure 4C:
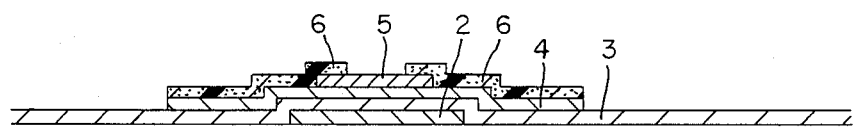
Figure 4D:
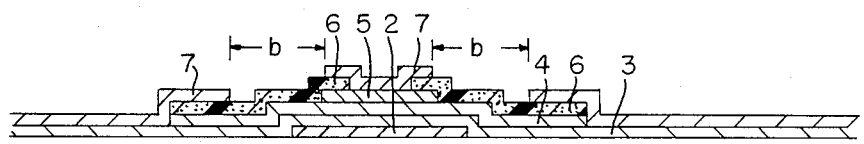
Figure 4E:
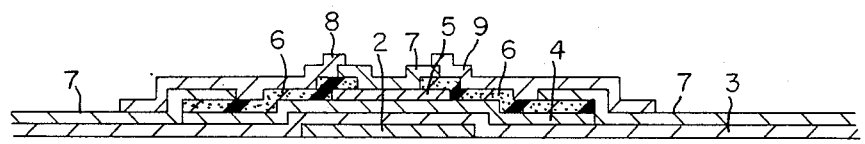
Figure 4F:
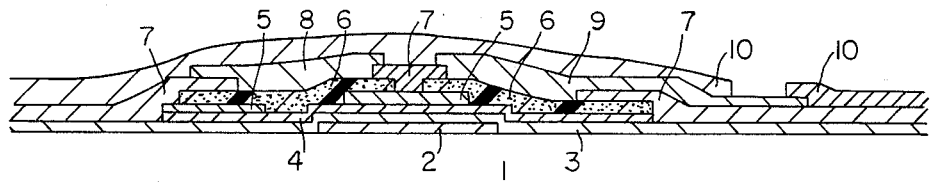
Figure 4G:
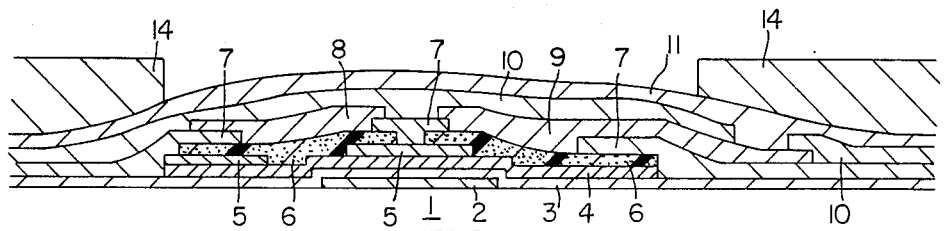
Figure 4H:
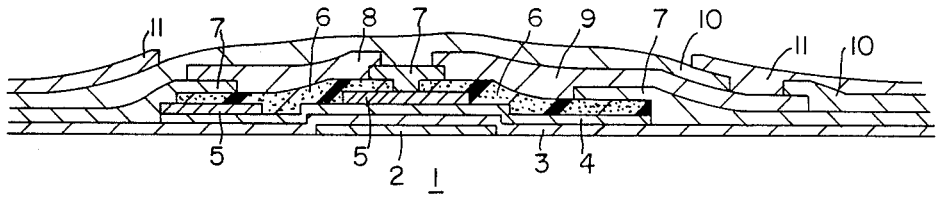

FIGS. 4(a) to 4(h) show a manufacturing process of the TFT of this example. First, on the glass substrate 1, the gate electrode 2 is formed, and over the whole surface the gate insulating film 3, a non-doped a-Si semiconductor film 4 and the protective insulating film 5 are continuously accumulated in a vacuum by the plasma CVD method (FIG. 4(a)). Then, the protective insulating film 5 is patterned (FIG. 4(b)). Next, the p-doped $n^+$-a-Si film 6 is deposited, and the $n^+$-a-Si film 6 and the a-Si semiconductor film 4 are etched with the same resist pattern (FIG. 4(c)). Then, the entire surface is covered with the insulating film 7, and on one part b of the top of the $n^+$-a-Si film 6, an opening section of the insulating film 7 is formed (FIG. 4(d)). Next, a metal film is deposited that covers the insulating film 7 and also forms a junction with the p-doped $n^+$-a-Si film 6, and this metal film is then patterned to form the source electrode 8 and the drain electrode 9 (FIG. 4(e)). For the metal film that is formed into these source electrode 8 and drain electrode 9, Ti, Al, Mo, etc., can be used. Next, the insulating film 10 is accumulated, and as shown in FIG. 4(f), a hole is made in the insulating film 10 on the drain electrode 9. This insulating film 10 is made of a silicon oxide film, a silicon nitride film, or an organic polymer film. Next, over the entire surface of the insulating film 10, a transparent conductive film 11 is deposited, followed by the application of a negative-type photo-resist 14 thereto. The wafer is then exposed to light through the glass substrate 1 and the portion of the photo-resist 14 covering the hole of the insulating film 10 that is placed above the drain electrode 9 is also exposed to light using a photomask. Next, the resist 14 after light exposure is developed to attain the patterning of the resist 14 as shown in FIG. 4(g). Then, as shown in FIG. 4(h), the transparent conductive film 11 is etched with the patterned resist 14 used as a mask, resulting in picture-element electrodes connected to each TFT, the plane view of which is shown in FIG. 1. The transparent film 11 forms a junction with the drain electrode 9 through the hole of the insulating film 10. The picture-element electrodes 11 attain self-alignment so that the gate electrode 2 and the source electrode 8 are not overlapped. In this way, the picture-element electrodes and the TFTs that are electrically connected to the said picture-element electrodes by the drain electrodes are formed into a matrix on a glass substrate. The gate electrode 2 and the source electrode 8 of the TFT are disposed to be perpendicular to each other on the glass substrate 1, and the gate electrode 2 and source electrode 8 of each TFT that are arranged in the lateral and longitudinal directions, respectively, are connected to the gate electrode 2 and source electrode 8 of the adjacent TFT. This glass substrate with TFTs is used as a cell substrate for the liquid-crystal display cell, and liquid-crystal materials of a twisted nematic field-effect type are enclosed in the space between said cell substrate and the other cell substrate on which the counter-electrode opposed to the picture-element electrodes is formed, resulting in the liquid-crystal display device of this example.

When driving voltage is selectively applied to the bar electrodes connected with the gate electrodes 2 and the bar electrodes connected with the source electrodes 8, the switching of the TFT operates by the selected gate and source electrodes 2 and 8, and voltage is applied to the picture-element electrode of the transparent conductive film 11 through the drain electrode 9. Because of an electric field created between the picture-element electrode and the counter electrode, the opto-electric characteristics of the liquid-crystals positioned at this electric filed are changed, resulting in a matrix-display pattern corresponding to this picture element.

The occurrence of leakage between the picture-element electrode made of the transparent conductive film 11 and the source electrode 8 is efficiently prevented by the insulating film 10 disposed therebetween. Moreover, the surface area of the picture-element electrode (i.e., the area marked by the oblique line in FIG. 1) can be larger than that of the picture-element electrode of the conventional TFT shown in FIG. 7.

EXAMPLE 2

Figure 5:
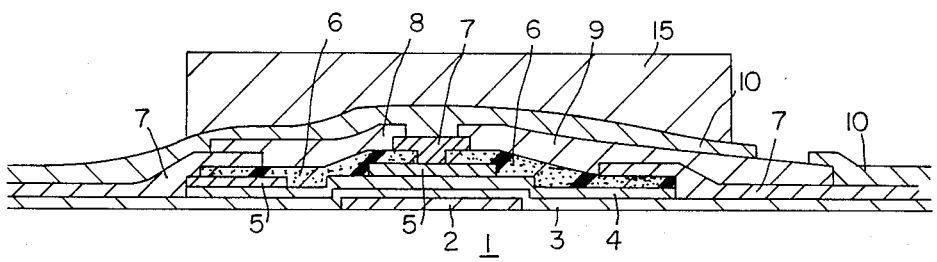
FIG. 5 is a schematic diagram showing another step of FIG. 4(g) in the manufacture process shown in FIGS. 4(a) to 4(h).
Figure 6A:
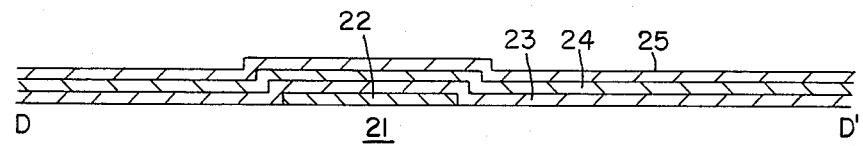
Figure 6B:
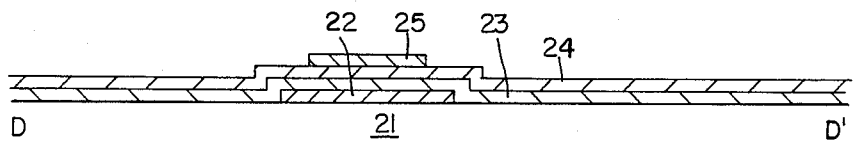
Figure 6C:
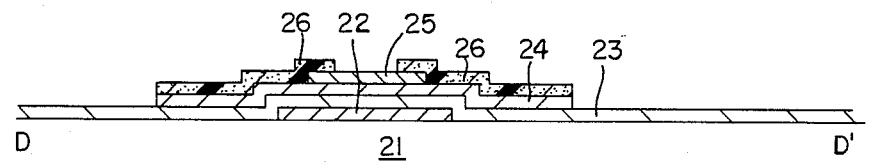
Figure 6D:
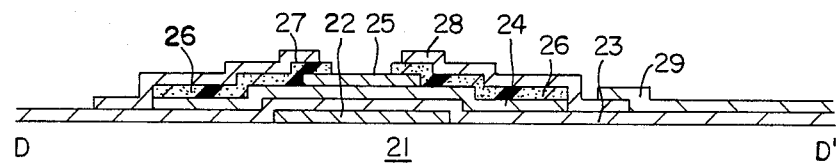

Another manufacturing process of this invention is described below:

A TFT is manufactured by the same steps as those shown in FIGS. 4(a) to 4(f) in Example 1. Thereafter, as shown in FIG. 5, on the insulating film 10, a positive-type photo resist 15 is applied, and light exposure is done through the glass substrate 1; the portion of the photoresist covering the hole of the insulating film 10 that is placed above the drain electrode 9 is also exposed to light with the use of a photomask. Thereafter, the resist 15 is developed to pattern the resist 15, after which a transparent conductive film 11 is deposited over the entire surface of the wafer. Next, this substrate with the TFTs is submerged into a solvent such as acetone, etc., to attain the patterning of the transparent conductive film 11 by the lift-off method, as is shown in FIG. 4(h). The plane view of the TFT shown in FIG. 5 is almost the same as that of the TFT in FIG. 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A liquid-crystal display device comprising thin-film transistors arrayed in a matrix, wherein each of said thin-film transistors comprises:
    an insulating substrate;
    a gate electrode disposed on said insulating substrate;
    a first insulating film covering said gate electrode;
    an amorphous Si semiconductor film disposed on said first insulating film;
    a second insulating film disposed on said amorphous Si semiconductor film;
    a p-doped $n^+$-amorphous Si film forming both a source and a drain on said amorphous Si semiconductor film and said second insulating film;
    a third insulating film covering said p-doped $n^+$-amorphous Si film, except for a part of said p-doped $n^+$-amorphous Si film, and said amorphous Si semiconductor film;
    a source electrode and a drain electrode forming junctions with said part of the p-doped $n^+$-amorphous Si film and covering said third insulating film; and a picture-element electrode, a part of which is superposed on said drain electrode.

2. A liquid-crystal display device according to claim 1, wherein bus bars connected to said gate electrode and bus bars connected to said source electrode are connected by a short ring of a p-doped $n^+$-amorphous Si film.

3. A liquid-crystal display device according to claim 2, wherein the resistance between the gate bus bars is different from that between the source bus bars.

4. A liquid-crystal display device according to claim 3, wherein the resistance between the gate bus bars is lower than that between the source bus bars.

5. A liquid-crystal display device according to claim 2, wherein the portions on which the source bus bars are disposed have said second insulating film and said amorphous Si semiconductor film.

6. A liquid-crystal display device according to claim 1, wherein the thin-film transistor further comprises a fourth insulating film disposed over the entire surface of the substrate including the source electrode and the drain electrode, said fourth insulating film having a hole in the portion thereof positioned above said drain electrode, and said picture-element electrode attaining self-alignment with respect to said gate and source electrodes and being connected to said drain electrode through the hole.

7. A liquid-crystal display device according to claim 3, wherein the portions on which the source bus bars are disposed have said second insulating film and said amorphous Si semiconductor film.

8. A liquid-crystal display device according to claim 4, wherein the portions on which the source bus bars are disposed have said second insulating film and said amorphous Si semiconductor film.

* * * * *